United States Patent [19]

Maraio et al.

[11] Patent Number: 5,426,360
[45] Date of Patent: Jun. 20, 1995

[54] SECONDARY ELECTRICAL POWER LINE PARAMETER MONITORING APPARATUS AND SYSTEM

[75] Inventors: Robert A. Maraio, Camillus, N.Y.; Richard L. Sieron, Milford; James W. Crimmins, Wilton, both of Conn.

[73] Assignee: Niagara Mohawk Power Corporation, Syracuse, N.Y.

[21] Appl. No.: 198,501

[22] Filed: Feb. 17, 1994

[51] Int. Cl.⁶ .................... G01R 15/04; G01R 15/12
[52] U.S. Cl. .................................... 324/126; 324/127; 324/72.5
[58] Field of Search ................ 324/126, 127, 117 R, 324/72.5

[56] References Cited

U.S. PATENT DOCUMENTS

| | | | |
|---|---|---|---|
| 3,674,916 | 7/1972 | Langella | 174/169 |
| 4,118,597 | 10/1978 | Proctor et al. | 324/117 R |
| 4,724,381 | 2/1988 | Crimmins | 324/127 |
| 4,786,862 | 11/1988 | Sieron | 324/126 |
| 4,799,005 | 1/1989 | Fernandes | 324/127 |
| 4,801,937 | 1/1989 | Fernandes | 324/127 |
| 4,808,917 | 2/1989 | Fernandes | 324/127 |
| 4,847,780 | 7/1989 | Gilker et al. | 364/483 |
| 4,868,893 | 9/1989 | Hammond | 455/617 |
| 4,905,205 | 2/1990 | Rialan | 367/77 |
| 4,999,571 | 3/1991 | Ishiko et al. | 324/96 |
| 5,003,278 | 3/1991 | May | 336/92 |
| 5,136,285 | 8/1992 | Okuyama | 340/870.11 |
| 5,180,972 | 1/1993 | Schweitzer | 324/127 |

Primary Examiner—Kenneth A. Wieder
Assistant Examiner—Kourosh Cyrus Khosravi
Attorney, Agent, or Firm—Heslin & Rothenberg

[57] ABSTRACT

A system for unintrusively determining parameters such as current, voltage and power delivered through a service line to a customer for verifying accuracy of the customer's entrance meter. The system includes a sensor apparatus for monitoring voltage and current on the power line. A voltage clamp mechanism is disposed within a sensor housing such that an insulation piercing voltage sensor can be manually actuated to pierce the electrical insulation of the power line and contact the conductor. The sensor apparatus also includes a split-core current transformer fabricated to minimize the air gap between the split-core sections when the apparatus is closed about the power line. A pole unit is electrically connected to each sensor apparatus for monitoring the voltage and current, calculating the power consumed in kilowatt-hours and storing calculated kilowatt-hours in memory with an appropriate date/time stamp, for subsequent retrieval and comparison with the customer's entrance meter readings. Data retrieval is accomplished via a hand-held ground unit, such as a palm top computer, which communicates via infrared signals with the pole mounted unit.

31 Claims, 11 Drawing Sheets

SECONDARY ELECTRICAL POWER LINE PARAMETER MONITORING APPARATUS AND SYSTEM

TECHNICAL FIELD

This invention relates in general to apparatus and systems for measuring and communicating operating parameters associated with electrical power conductors, and in particular, to apparatus and systems for unintrusively monitoring parameters such as current and voltage provided through a service line to a customer of electric power for verifying accuracy of the customer's entrance meter.

BACKGROUND ART

Various power line sensors are disclosed in the prior art. For example, reference U.S. Pat. Nos.: 3,428,896; 3,633,191; 4,158,810; 4,268,818; 4,724,381; 4,799,005; and 4,808,917. In general, all of these sensors have been proposed for dynamic line rating of electrical power and are designed to be permanently installed on high voltage transmission lines. The typical transmission line sensor available in the prior art measures quantities associated with operation of the overhead line such as voltage on the conductor, current flow in the conductor, conductor temperature and ambient temperature. This information is gathered and transmitted to a local ground receiver. Data from various ground receivers is ultimately transmitted to a central control station where the information is analyzed. Based on this analysis, the entire power transmission system is controlled with power being supplied to the various transmission lines in accordance with the measured parameters.

Although existing sensors for monitoring high voltage transmission lines are of interest, the present invention addresses a different problem. Specifically, a need exists in the utility industry for a portable, pole/line installed sensor and parameter collection system to measure individual customer service electric energy consumption at the secondary level. The purpose of such a sensor is to accumulate a power consumption history in kilowatt-hours for comparison with readings from the customer's existing entrance meter as a means of detecting possible meter tampering.

Existing transmission line sensors have a number of inherent drawbacks when considered as monitors for uncovering customer meter tampering. For example, most prior sensors are physically cumbersome, employing large clamp-on ammeters. Existing sensors typically require considerable time to install, which in combination with their sprawling bulkiness would draw attention to the sensor and alert a customer that secondary monitoring is occurring. Typically, existing voltage connections require additional wires that must be connected to live service conductors. Further, care must be taken to connect such voltage wires to the conductors in a correct order; and there is no simple way to tell if conductors have been connected properly. In addition, kilowatt-hour readings of the monitoring system would have to be taken at the same time as the customer's meter reading in order to correlate the two readings.

Thus, the present invention comprises a new secondary parameter monitoring and analysis system which overcomes the aforementioned disadvantages of existing high voltage transmission line systems when considered as a secondary load monitoring device. Among the specific objects of the invention, all within the context of systems for collecting and transmitting parameters associated with electrical power line operation employing line-mounted sensor modules, are: a compact sensor unlikely to draw a customer's attention; quick and easy installation, again so as not to draw a customer's attention; good accuracy, i.e., on the same order of accuracy as an entrance meter; avoidance of a need to simultaneously take readings off the monitoring system and the customer's meter; and an ability to accommodate all entrance configurations, including secondary voltages through 480 volts, three-phase, with various service conductor diameters. Further, an ability to report kilowatt-hours within a maximum error of five percent with currents ranging from 1-800 amperes is desired.

DISCLOSURE OF INVENTION

Briefly summarized, the present invention comprises in one aspect a sensor apparatus for monitoring voltage on a power line having a service conductor surrounded by electrical insulation. The sensor apparatus includes a sensor housing and a voltage clamp mechanism disposed within the housing. The voltage clamp mechanism has an upper support and a lower support sized to cradle the power distribution line. Clamping means is provided for forcing the upper support towards the lower support. The lower support is spring-biased relative to the sensor housing and has an insulation piercing voltage sensor disposed in an opening therein. The insulation piercing voltage sensor is fixedly mounted relative to the sensor housing and shaped to pierce the electrical insulation surrounding the service conductor of the power line when exposed from the lower support. When the upper support is forced against the power distribution line by the clamping means, the lower support is moved towards the sensor housing and the insulation piercing voltage sensor is exposed from the lower support to pierce the electrical insulation and physically and electrically contact the service conductor of the power line.

In another aspect, the invention comprises a sensor apparatus for monitoring current and voltage of a power distribution line having a conductor encased within electrical insulation. This sensor apparatus includes a sensor housing having an upper portion pivotally connected to a lower portion. In addition, a split-core current transformer is provided for monitoring current passing through the power distribution line. An upper half of the split-core current transformer resides within the upper portion of the sensor housing and a lower half of the split-core current transformer resides within a lower portion of the sensor housing. A voltage sensor is also provided for monitoring voltage on the power distribution line. The voltage sensor has an upper support and a lower support sized to cradle the power distribution line there between when the sensor housing is closed about the line. The upper support of the voltage sensor resides in the upper portion of the sensor housing and the lower support of the voltage sensor resides in the lower portion of the sensor housing.

The voltage sensor further includes an insulation piercing member capable of piercing the electrical insulation of the power distribution line as the upper portion of the sensor housing is forced towards the lower portion of the sensor housing with the power line cradled between the upper support and the lower support. With the upper portion of the sensor housing in opposing relation to the lower portion of the sensor housing the sensor housing can be clamped to the power line to simultaneously establish a voltage connection to the conductor of the power distribution line through the insulation piercing member, such that the voltage of the conductor can be monitored, and locate the upper half of the split-core current transformer relative to the lower half of the split-core current transformer, such that current through the conductor can be monitored.

In still another aspect, at least one line-mounted sensor apparatus as outlined above is combined with data memory for storing sensed parameters and kilowatt-hour values, and control means is electrically coupled to the at least one line-mounted sensor apparatus and to the data memory for coordinating periodic sensing of parameters representative of power through the conductor, calculating kilowatt-hour values, and storing the sensed parameters in a history file within the data memory. Preferably, a hand-held ground unit is also provided for periodic downloading of the history file from data memory.

In a further aspect, a sensor apparatus is provided for monitoring current of a power line having a conductor surrounded by electrical insulation. This sensor apparatus includes a sensor housing having an upper portion pivotally connected to a lower portion. The upper portion and the lower portion are sized to receive the power line such that the power line passes through the sensor housing when the sensor housing is closed thereabout. A split-core current transformer monitors current passing through the power line. This transformer has an upper half residing within the upper portion of the sensor housing and a lower half residing in the lower portion of the sensor housing. A controller is disposed external to and removed from the sensor housing. This controller has memory associated therewith and a tandem current transformer coupled to the split-core current transformer through an electrical cable. The split-core current transformer has a secondary winding connected to a primary winding of the tandem current transformer. The split-core current transformer and the tandem current transformer cooperate to monitor current through the power line over a current range of one to several hundred amperes.

To restate, sensor apparatus and a monitoring system are presented for unintrusively monitoring parameters such as current and voltage provided through a service line to a customer for inconspicuously verifying accuracy of the customer's entrance meter. Corresponding kilowatt-hour values are automatically, periodically determined and saved in a history file. Information is downloaded via an IR link for transport to a central office where the secondary readings can be compared with the customer's standard meter readings. A compact line sensor is described which is unlikely to draw a customer's attention. Installation is quick and easy, again so as not to draw a customer's attention (e.g., within fifteen minutes). Accuracy of the monitoring system is minimally, as good as that of a typical electric entrance meter. Because extensive histories can be generated and saved within the pole unit with corresponding date and time stamps, there is no need to simultaneously read the customer's meter for comparison. This sensor apparatus and system presented can accommodate all entrance configurations, including secondary voltages through 480 V, three-phase, with various service conductor diameters. Further, currents ranging from 1-800 amperes can be detected with a maximum kilowatt-hour error of less than or equal to five (5%) percent.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Refer now to the drawings wherein the same reference numbers are used throughout multiple figures to designate the same or similar components.

Figure 1:
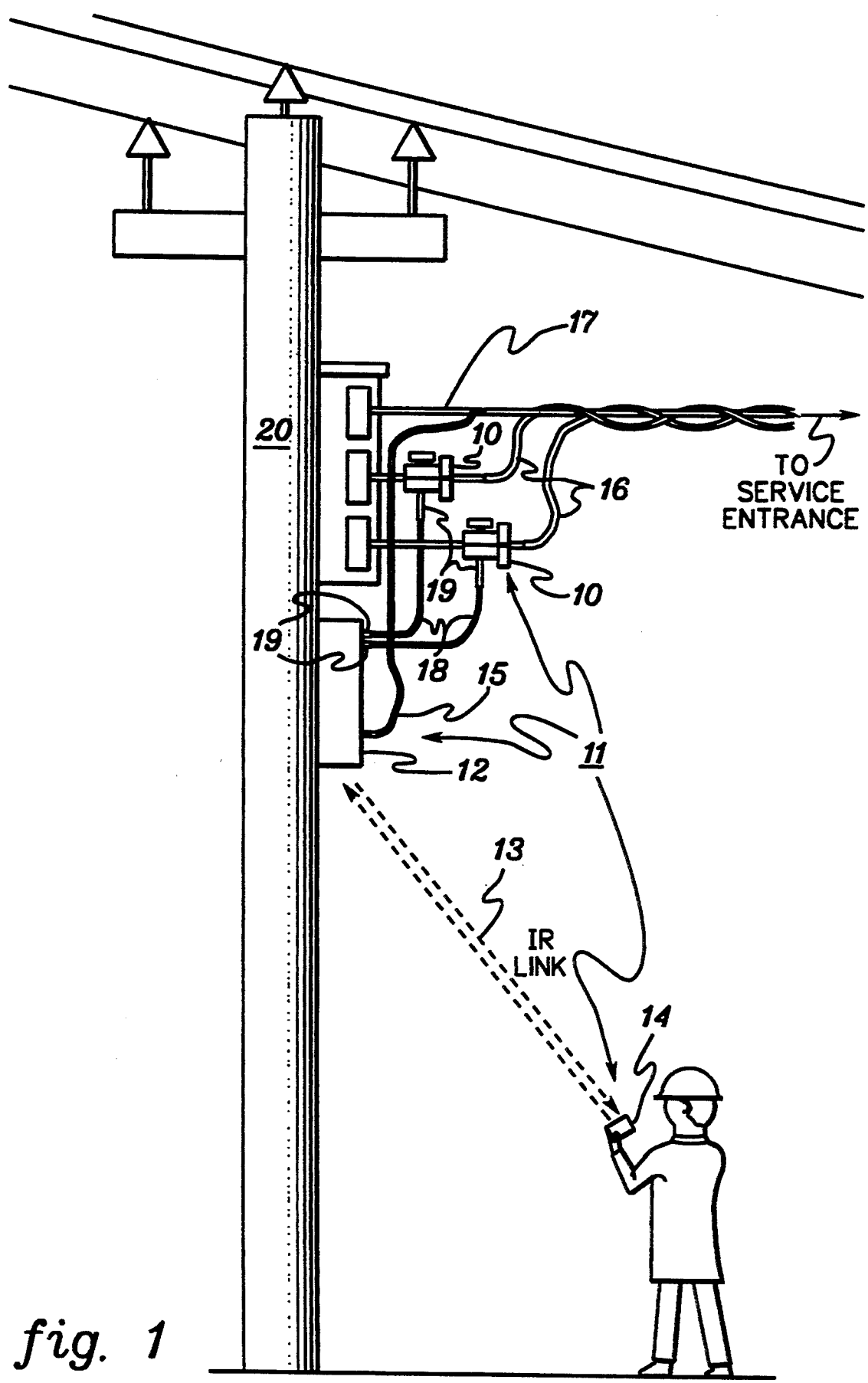
FIG. 1 is an elevational view of one embodiment of a secondary load monitoring system in accordance with the invention, shown connected to a two-input electric service.

Beginning with FIG. 1, in order to achieve the objectives of the present invention, a secondary load monitoring system 11 embodiment is proposed consisting of three major components; namely, one or more sensor apparatus 10, a pole unit 12, and a ground unit 14. Each of these components is first introduced and then described in detail below.

Sensor apparatus 10 are compact devices that clamp to service conductors 16 of the customer's "two-phase" electric entrance. Each sensor has a split-core current transformer (similar to a clamp-on ammeter) to sense current, and a conductor tapping mechanism for line voltage monitoring. This mechanism includes a sharp pin which upon piercing the insulation of the service line clamps the sensor apparatus to the service line and establishes an electrical connection to the service line for monitoring voltage. A sensor apparatus is installed on each "phase" conductor of an entrance to be monitored. Each sensor has a flush female connector for a plug-in type cable 18 for connection to pole unit 12. The sensor apparatus are initially installed without connecting cables 18 attached in order to be unencumbered during the installation and clamping procedure. The sensor apparatus 10 have no large protrusions and are roughly cubical in shape so that they are easily handled and do not catch on unintended structures during installation.

By way of example, pole unit 12 is a rectangular box which can be secured to a power pole 20 by lag bolts or plastic ties. Plug-in cables 18 connect from sensor apparatus 10 to pole unit 12. The pole unit receives analog current and voltage signals from the sensors. The pole unit 12 contains electronics (including a microprocessor) that determine kilowatt-hours consumed, for example, every 15 minutes, and store the results in digital RAM along with a date-time stamp. The pole unit's electronics are powered from the voltage connection made by one (or more) of the respective sensor apparatus 10 to the service conductor 16.

Pole unit 12 is interrogated by a hand-held portable ground unit 14 via, preferably, an infrared link 13. A history file of power consumption may be transferred from the pole unit to the ground unit in a matter of seconds. The ground unit can, in turn, transfer the history file to a computer at a central office for comparison with the customer's corresponding meter readings. (Obviously, various time intervals for comparison of monitored power readings could be employed.) Ground unit 14 is preferably a hand-held battery operated unit which employs a palm top PC, such as the Hewlett Packard HP100 PC. Unit 14 employs an infrared transceiver to communicate with pole unit 12. Ground unit software controls initializing the pole unit at installation time, retrieving histories from the pole unit, and transferring power consumption history files to the central office computer. When not in use, the ground unit can be connected to a wall charger.

Figure 2:
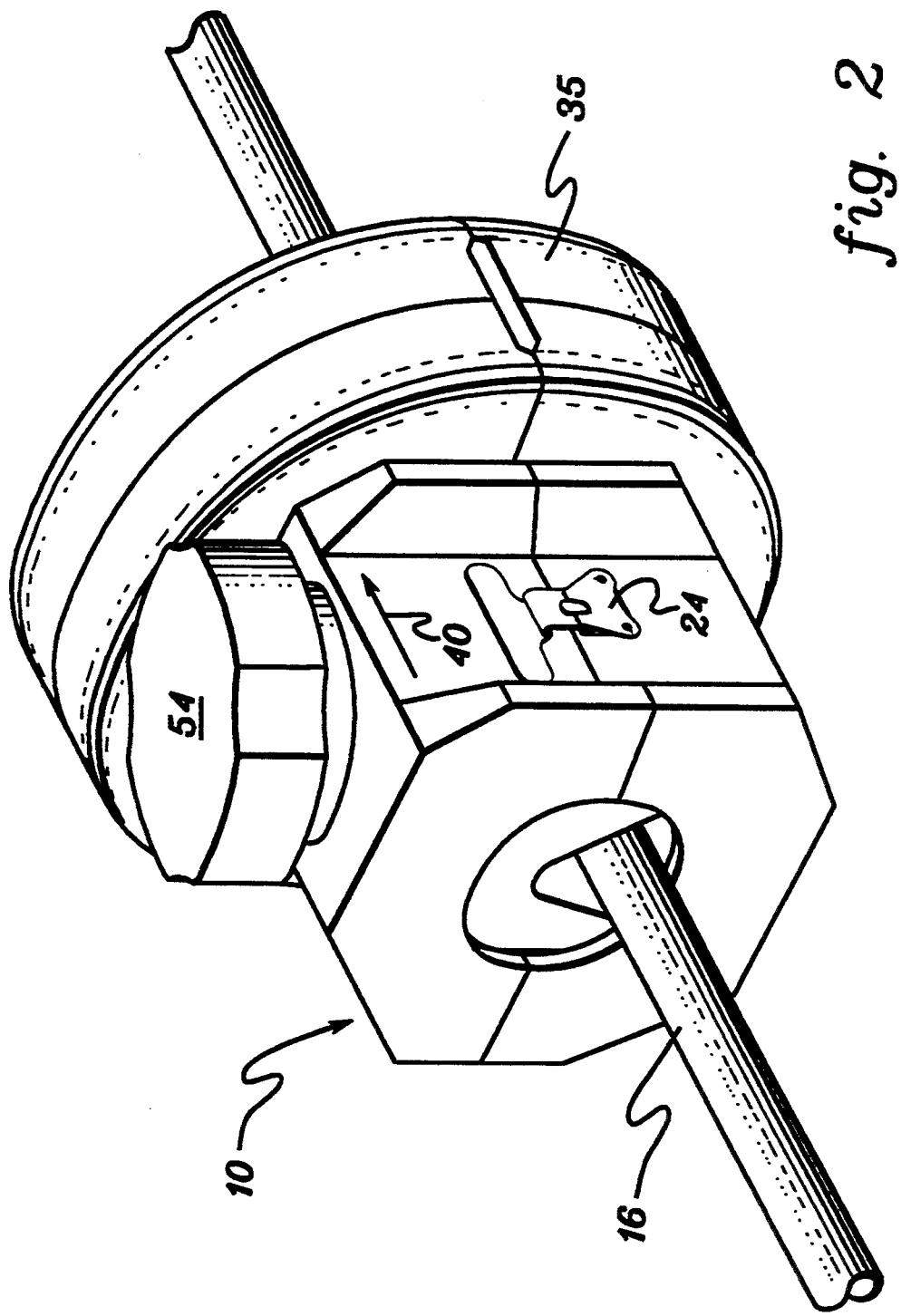
FIG. 2 is a perspective view of the compact sensor apparatus of FIG. 1 shown closed about a power distribution line.
Figure 3:
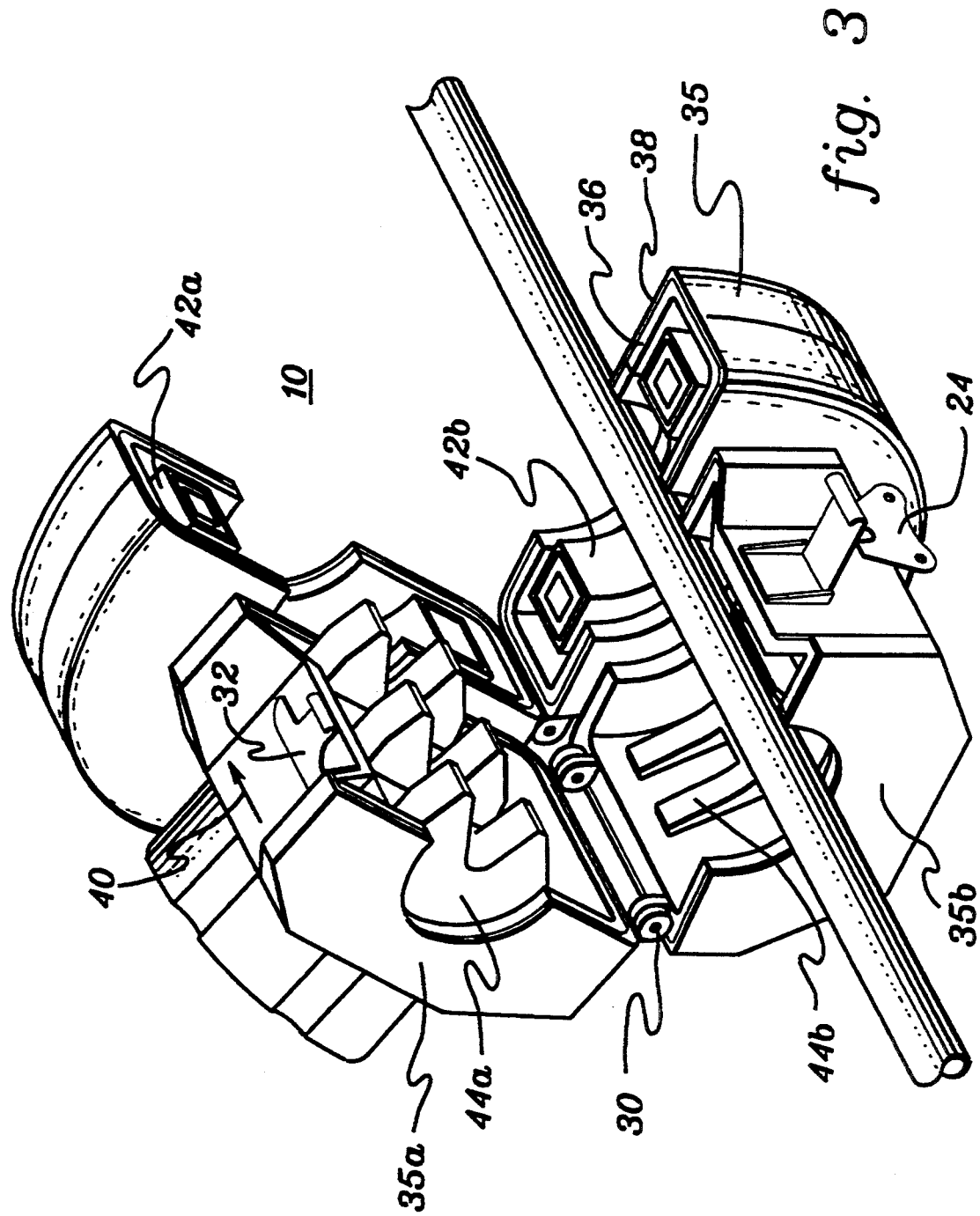
FIG. 3 is a perspective of the compact sensor apparatus of FIG. 2, shown open and cradling the power distribution line.
Figure 4:
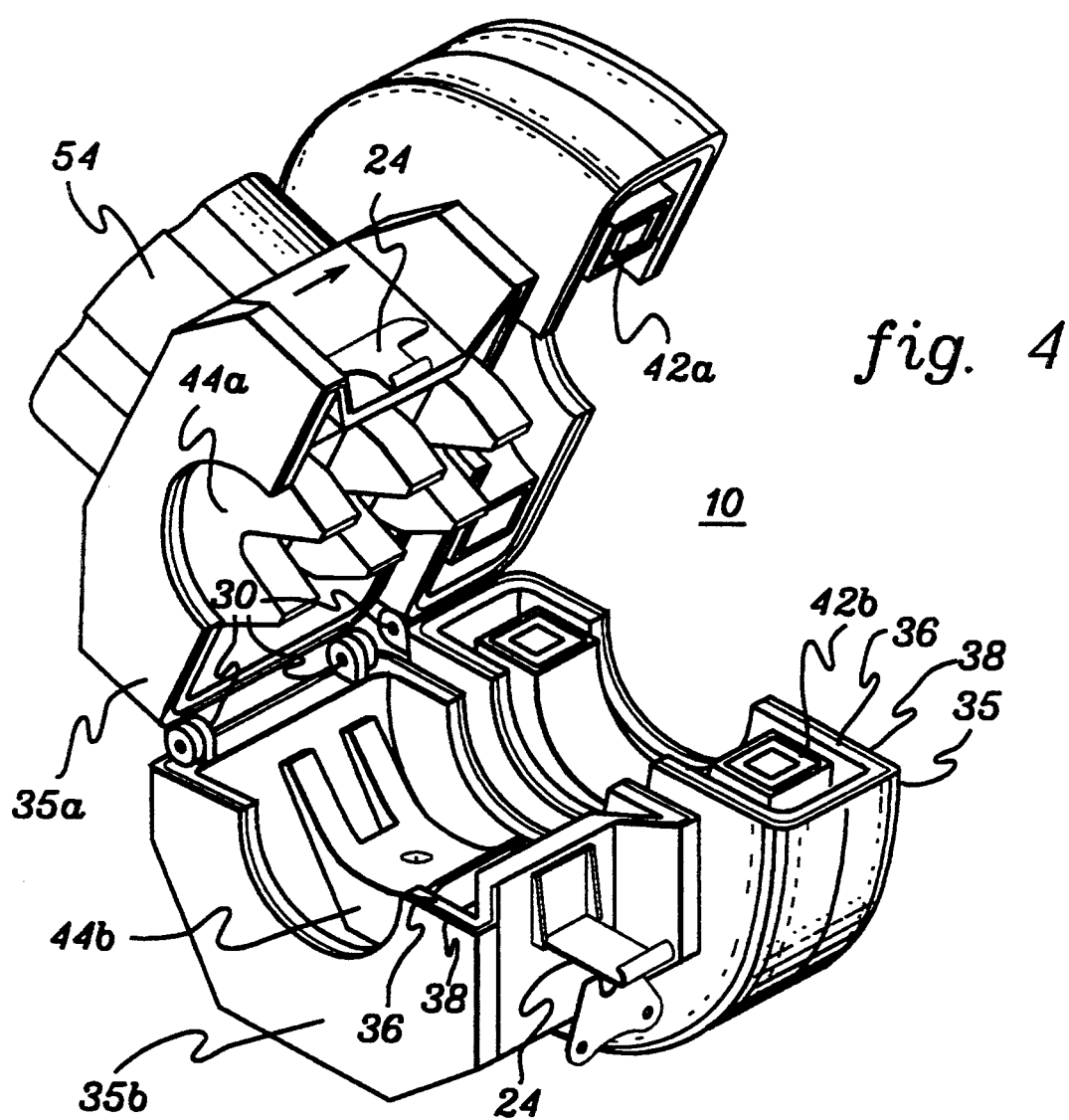
FIG. 4 is a perspective of the compact sensor apparatus of FIG. 2, shown open.

FIGS. 2–6 depict in detail a preferred embodiment of sensor apparatus 10. In this embodiment, apparatus 10 comprises a roughly cubical sensing device, being for example approximately 4–5 inches on a side. In FIG. 2 sensor apparatus 10 is shown closed about a service line 16, which may comprise an insulated aluminum or copper conductor. When initially closed about line 16, apparatus 10 is secured by a hasp 24. As shown in FIGS. 3 & 4, sensor apparatus 10 pivots open and closed about multiple hinges 30. A ratcheting turning knob 54 is manually actuated once sensor apparatus 10 is secured about line 16, to force the apparatus into clamping engagement with the conductor of the service line. Knob 54 preferably turns freely when the sensor apparatus is fully clamped to the service conductor. In one embodiment, sensor apparatus 10 accommodates a range of conductor sizes, for example, from $\frac{3}{8}''$ diameter to 1 1/16" diameter service conductors, including surrounding electrical insulation.

Sensor apparatus 10 has a housing 35 with a metal framework 36 and a polycarbonate shroud 38 completely covering the metal, except in an area recessed for hasp 24. Thus, the potential shock hazard to an installer is limited. Further, the multiple sensor apparatus can contact one another and other service conductors, or structures on an adjacent power pole without concern. Preferably, sensor apparatus 10 has a large arrow 40 molded on its exterior surface and colored to contrast with the housing's exterior. For example, arrow 40 might be white if the rest of the housing exterior is black. Each sensor apparatus 10 is identical and is installed with arrow 40 pointing along service line 16 in the appropriate direction, for example, towards a customer's electric entrance. By so installing each sensor, proper power monitoring polarity is ensured.

As noted, each sensor apparatus is preferably initially installed unencumbered, i.e., without cable 18 connected thereto. After all sensors have been positioned and clamped in place, they can be connected to pole unit 14 using preassembled cable 18. Each cable has a male connector plug 19 (FIG. 1) at each end for coupling to the female connectors 51 of the sensor apparatus (FIG. 6) and the pole unit using a simple push motion. Preferably, the connectors on each end of the cables are identical so that either end can connect to the sensor apparatus or the pole unit, and so that cables 18 can be used interchangeably. Again, an object of the invention is to present a secondary load monitoring system which can be quickly installed without drawing a customer's attention.

As best shown in FIGS. 3 & 4, sensor apparatus 10 includes a split-core, clamp-on current transformer (CT) 42 and a conductor engaging mechanism 44, which preferably hinge open together. Current transformer 42 has an upper half 42a and a lower half 42b. The upper half 42a of current transformer 42 is disposed within an upper portion 35a sensor apparatus housing 35, while lower half 42b of current transformer 42 resides within a lower portion 35b of sensor housing 35. Similarly, conductor engaging mechanism 44, which comprises the voltage sensing apparatus, includes an upper support 44a lower support 44b which are roughly sized to cradle the service line to which the sensor apparatus is clamped. Upper support 44a is affixed to the upper portion of the sensor housing, and lower support 44b mechanically couples via a spring-biasing mechanism to a supporting surface of the lower portion 35b of sensor housing 35. The current transformer and voltage sensing mechanism are each discussed in detail below.

A preferred split-core current transformer has a tape wound core of eighty percent (80%) nickel, twenty (20%) percent iron and lapped pole faces. The core cross-section comprises a $\frac{3}{8}''$ square for good mechanical stability; however, a smaller cross-section could possibly satisfy predefined magnetic requirements. The current transformer is capable of sensing current within a wide range of values, e.g., within a 1 to 800 ampere range, such that kilowatt-hours is determined with a maximum error of five (5%) percent over all possible operating conditions. When hinged opened (FIGS. 3 & 4), the upper and lower core halves have a small amount of freedom of motion within the sensor housing to ensure good mating of the core halves when closed. When the sensor apparatus is closed, approximately five pounds of force presses the two core halves together. That, plus the lapped pole faces ensures that the pole faces mate with a minimum air gap, which is an important consideration for obtaining accurate current measurement.

Preferably, an 800 turn copper winding is wound evenly over most of the circumference of the core to ensure minimum leakage reactance, which minimizes burden. This is another important requirement to obtaining accurate current measurement. The resistance of the winding is 2.75 ohms at room temperature and must dissipate 2.75 watts with an 800 ampere primary current. "Mu" iron alloy strips are strategically positioned around the magnetic core to shield the core from magnetic fields generated by adjacent current carrying conductors, or from a power transformer located on the same pole.

Figure 7:
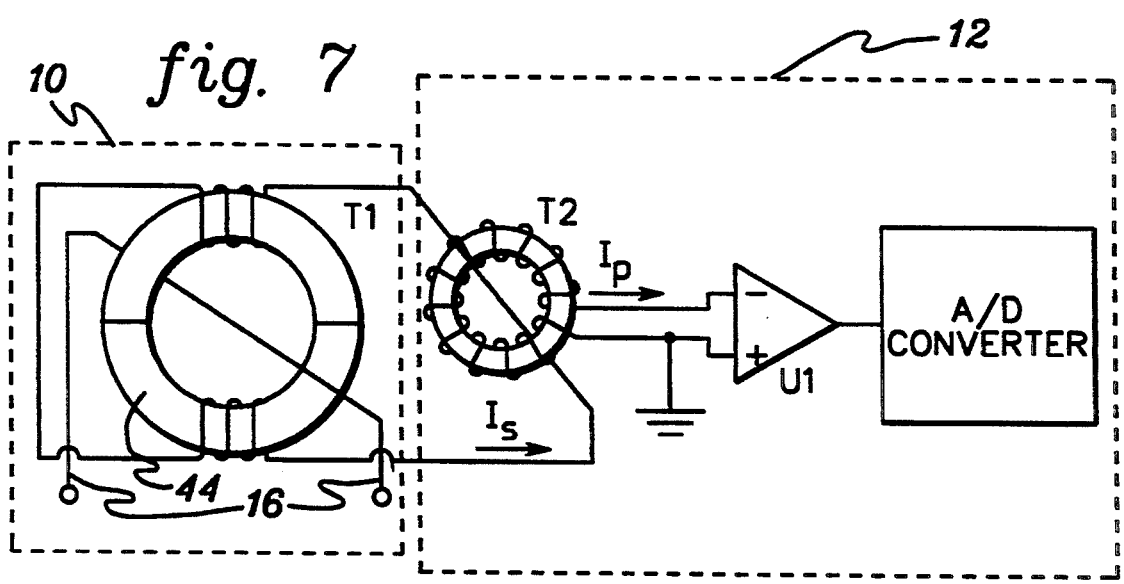
FIG. 7 is a general schematic of the double transformer, current sensing operation of the compact sensor apparatus and pole unit in accordance with the invention.

As a specific example, refer to FIG. 7 where the current signal I, transferred to the pole unit might be one ampere down to ten milliamperes peak, since the maximum specified load current is 800 amperes RMS (1131 amperes peak), an overall current transformer ratio of 113,100:1 is required. With the lower limit of load current of the service conductor for a specified purpose at 1 ampere RMS, a 113,100:1 transformer ratio would yield 8.8 microamperes RMS at the pole unit. Such a low level of current transmitted, for example, over six feet of cable from the sensor apparatus to the pole unit would be susceptible to magnetic fields.

One solution is to use a second current transformer T2 at the pole unit in tandem with the current transformer T1 within apparatus 10. 800 turns on the sensor apparatus current transformer T1 and 141 turns on the tandem pole unit transformer T2 yields the desired 113,100:1 ratio, and a twisted pair cable connected between sensor apparatus current transformer and the pole unit provides good noise immunity from magnetic fields. The pole unit current $I_p$ generated through tandem current transformer T2 is amplified U1 and fed to an analog-to-digital converter, as described further below in connection with FIG. 8.

As noted, each sensor apparatus is first installed about a service conductor without being electrically connected to the pole unit. However, the current transformer in the sensor apparatus must not be open circuited with current flowing in the service conductor. Thus, two strings of three back-to-back diodes (not shown) can be installed in each sensor apparatus across the current transformer secondary winding. When a connection to the pole unit is made, the peak voltage across that winding with 800 ampere primary current flowing is approximately 1.4 volts. Three diodes in series will divert approximately 1 milliampere at 60° C., representing an error of 0.1%. With the electrical connection to a sensor apparatus disconnected, the secondary current will flow through the diodes. Without these diodes, thousands of volts could be generated within the sensor with an open circuited secondary.

Another significant feature of the current transformer is that the magnetic core air gaps are as small as possible when the sensor apparatus is closed so as not to degrade current measurement accuracy. The cores are, preferably, provided with lapped pole faces and when a few pounds of force is applied, the split-core halves are allowed to mechanically float somewhat to ensure that the faces are co-planar, thereby minimizing any resultant air gap between the halves. Preferably, each sensor apparatus current transformer has windings wound to a specification of 800 turns ±0 turns. This allows a sensor apparatus to be installed on any "phase" of any entrance configuration without the need to individually calibrate the units. Possible entrance configurations include single phase 120-240, two legs of 120/208 Y, three phase 120/208 Y, 227/408 Y, 240 Δ or 480 Δ. The number of sensor apparatus required depends upon the particular configuration encountered.

The voltage sensing mechanism of each sensor apparatus includes a sharp pin which automatically pierces the electrical insulation of the power distribution line as the sensor apparatus is clamped about the line to make electrical connection to the conductor of the service line. Preferably, the pin is made of berillium copper, which is compatible with both aluminum and copper conductors. The pin can be round in cross-section, with a diameter of 0.08"at its base and a height of 0.170" with a sharp point at its tip. There is a wide shoulder at the base of the pin to bottom the service line against once the pin has penetrated 0.170". This prevents excessive penetration of the line. The force on the pin while penetrating the power distribution line is approximately 35 pounds, which is roughly 5 times that required to reliably pierce frozen insulation, i.e., the hardest insulation to pierce. When removed, the pin leaves a hole 0.06" in diameter in polyethylene insulation.

Figure 5:
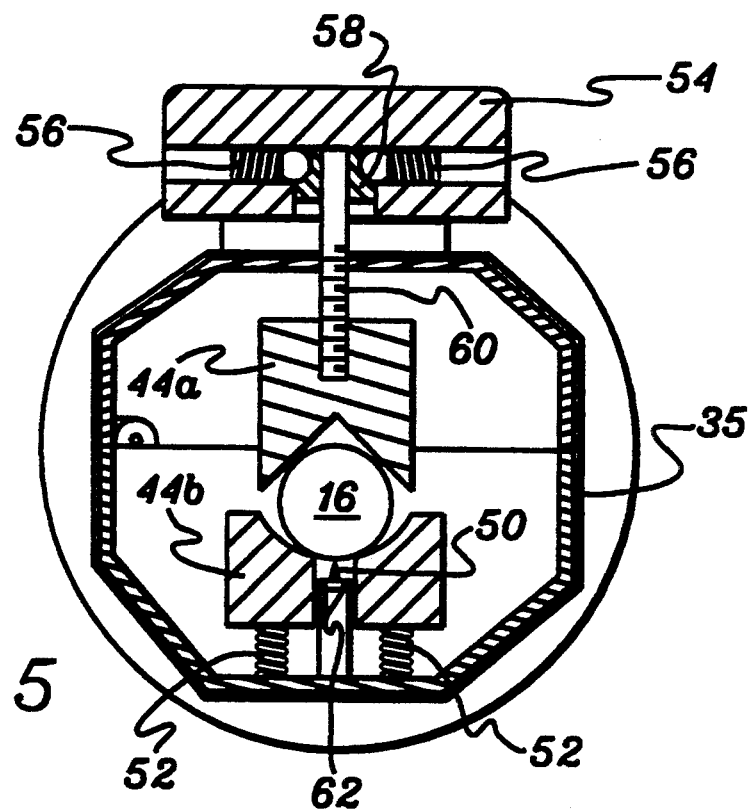
FIG. 5 is an elevational cross-sectional view of one embodiment of the voltage tapping mechanism of the compact sensor apparatus of FIG. 2.
Figure 6:
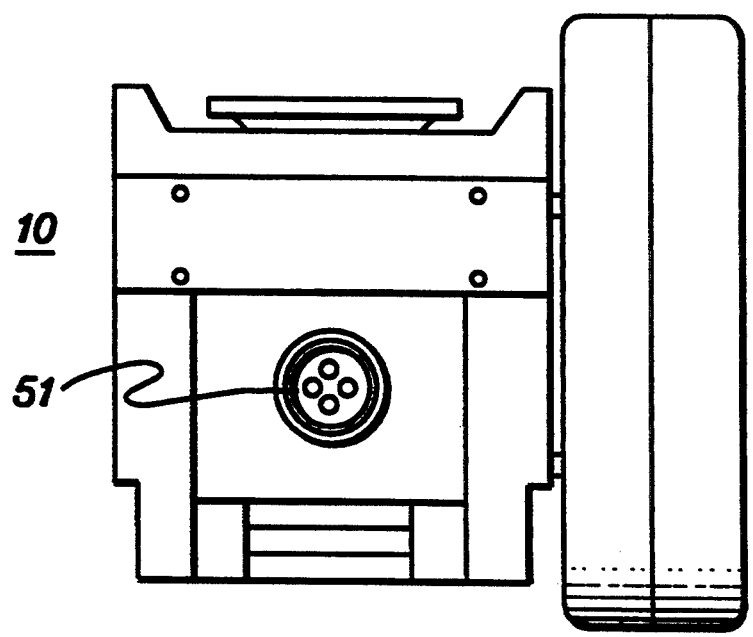
FIG. 6 is a bottom plan view of the compact sensor apparatus of FIG. 2.

Operation of voltage clamping mechanism 44 can best be explained with reference to FIG. 5. When the sensor apparatus initially closes about a service line 16, the upper support 44a is moved into contact with the line. Because there is substantially no downward pressure on the lower support 44b, the insulation piercing pin 50 remains unexposed within the spring 52 biased lower support 44b. Again, lower support 44b and upper support 44a are sized to cradle service line 16 when the sensor apparatus is closed about the line. As ratcheting knob 54 is rotated clockwise, the spring loaded pawls 56 press against the interdental surfaces in post 58 causing post 58 to rotate with ratcheting knob 54. An acme threaded rod 60, which is integral with post 58, also rotates and the mating thread on the inside of upper support 44a causes the support to move downward and press against wire 16 and hence the lower support 44b, such that insulation piercing pin 50 is exposed and pierces the insulation surrounding the conductor of the service line to make electrical contact therewith.

As the upper support 44a is forced downward, the lower support is similarly forced, compressing springs 52. Once pin 50 has sufficiently pierced the power line, the insulation about the line contacts a shoulder 62 of pin 50 and essentially prevents further movement of the upper support. Increasing resistance to turning of the ratcheting knob 54 will cause pawls 56 to cam out of the interdental surfaces in post 58 and cease to cause rod 60 to rotate. This mechanical action is similar to a detenting gas cap.

To unclamp the sensor apparatus, ratcheting knob 54 is rotated counterclockwise. Pawls 56 will then press against the interdental surfaces on post 58 at such an angle so as not to allow camming action, and knob 54 rotation will be transmitted to rod 60, with the acme threaded rod causing the upper support to retract. As the upper support retracts, springs 52 press against the lower support and the lower support presses against the power line, disengaging pin 50 from the line 16. Preferably, the voltage connection through pin 50 provides both the analog voltage signal through the power line and the operating power for the pole unit. This voltage connection is therefore made before (i.e., upstream using the power delivery direction) the current transformer so that the power consumed by the pole unit is not included in the power consumption measurement.

Preferably, pole unit 14 has a polycarbonate enclosure. Further, a detachable cover, which in normal use remains in place, is gasketed to provide a good seal against moisture. The unit is attached via aluminum brackets which have holes for lag bolting or lag screwing the unit to a power pole. In addition to memory and a controller, pole unit 14 includes three additional sub-assemblies; namely, an analog-to-digital circuit board, a power supply circuit board, and an infrared transceiver.

("Limo" female connectors are mounted on the outside wall of the enclosure, to which cables 18 & 15 connect from the sensor apparatus 10 and from the neutral conductor (FIG. 1). The connector assigned to a third phase sensor apparatus has a weather tight cap affixed thereto when two single phase lines are being monitored.)

The analog, digital and infrared transceiver circuit boards require +5 V, +12 V and −12 V dc power. Since the available power source comprises the customer service line, it would seem that transformers would be necessary to step down the 120–480 volts to a lower voltage and then rectify, filter and regulate the resultant signal. However, the 60 hertz analog current input stage has its lowest specified operating level at 12.5 microamperes RMS, which could be unduly affected by the magnetic field produced by a power transformer located inside the pole unit enclosure.

Figure 8:
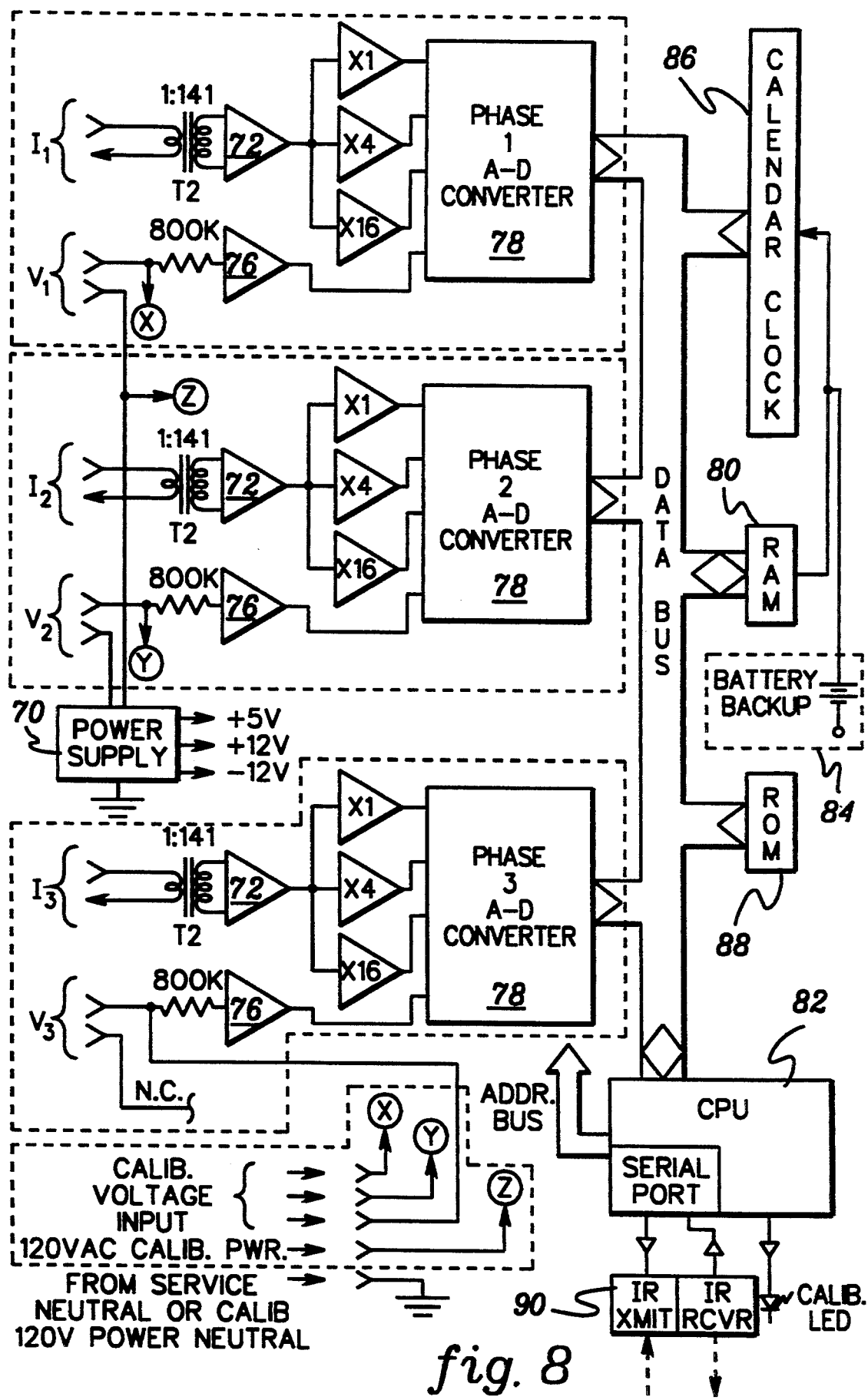
FIG. 8 is a detailed schematic of one embodiment of the pole unit of the secondary load monitoring system of FIG. 1.
Figure 9:
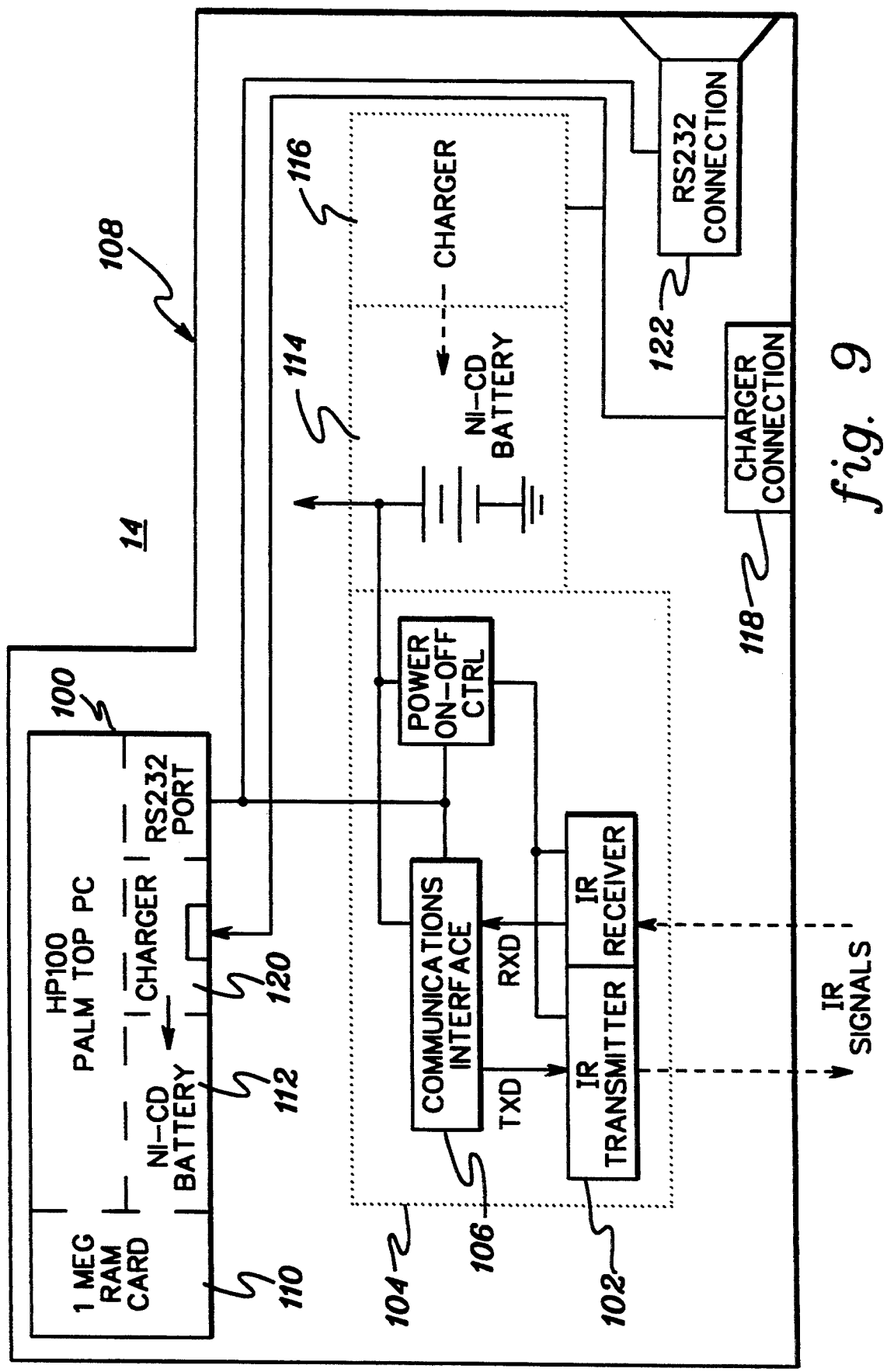
FIG. 9 is a detailed schematic of one embodiment of the ground unit of the secondary load monitoring system of FIG. 1.

Accordingly, the incoming first phase voltage $V_1$ is preferably wired to a 15 microfarad ac rated capacitor in series with a triac to the service neutral. Voltage across the triac is rectified and filtered to provide plus and minus dc voltages, the magnitude of which are controlled by a regulator circuit firing the triac gate to produce raw +20 and −20 volts. The raw plus and minus volts are further regulated to provide the final +5 V, +12 V and −12 V. The amount of current drawn from the first phase is therefore mainly determined by the reactance of the 15 microfarad capacitor which is 0.68 amperes at 120 volts and 1.57 amperes at 227 volts. A circuit similar to the one described could also be connected between a second voltage $V_2$ and neutral, except that the capacitor would be 7.5 microfarads, and its rectifiers assist providing the +20 and −20 V raw supplies. This second power circuit is not essential except when needed to accommodate powering of the pole unit from a three-phase floating delta configuration. In that case, there is a path for current to flow through both capacitor-triac circuits from the first single phase line to the second single phase line. Referring to FIG. 8, this circuitry resides within power supply 70, which has as inputs voltage signals $V_1$ and $V_2$.

Operating power for the pole unit is brought from the sensor apparatus to the pole unit by one of the four conductors in each connecting cable. Another conductor in each cable brings in separate voltage signals ($V_1$, $V_2$ and $V_3$) to the pole unit for the analog voltage measurement. (Again, which signals exist depends upon the customer's entrance configuration.) One conductor is not used for both functions since it would introduce a small error in voltage measurement due to the IR drop to the power supply required to power the pole unit. As noted, the operating power for the pole unit is not included in the power measured by the secondary load monitoring system. This is because the voltage tap point at the sensor apparatus is ahead of the current transformer and so the current drawn by the pole unit is not seen by the current transformer.

Each connecting cable is sealed for moisture and rated for 2400 V and 5 amperes. The conductors have teflon insulation for maximum toughness. The cable for the neutral connection uses a "LIMO" high quality connector 19. The pin arrangement on a connector 15 for the neutral is different from that for the phase conductors, making it impossible for improper connection.

Also, a special cable (not shown) is available for calibration purposes. This special cable plugs into the female connector on the pole unit normally used for the neutral connection. The cable has multiple pigtail leads. Using those leads, 120 V ac can be provided to the pole unit to power it, making it unnecessary to use the voltage piercing pin on the sensors. Other leads are connected to metered voltage. To calibrate a set of sensors with a pole unit, the sensors are clamped to a conductor carrying metered current while operating power and metered voltage is provided via the special cable.

As shown in FIG. 8, the other two conductors of each cable comprise an analog signal corresponding to the current flowing in the associated service line. The analog current signal from each sensor apparatus is brought to a six turn primary of the "tandem" current transformer T2 noted above. This transformer is a tape wound, high permeability toroid. An 846 turn secondary drives a transconductance configured operational amplifier 72. Each sensor apparatus current transformer T1 sees a burden which is composed of the vector sum of: the resistance of the sensor current transformer windings, the leakage reactance of the current transformer, the resistance of the sensor apparatus to pole unit cable, the equivalent impedance of the tandem transformer T2, the reflected value of a 10 ohm resistor in series with the input of the transconductance amplifier (to stabilize offset voltage) and the reflected value of the near zero input impedance of the transconductance amplifier. The total burden is very low, which as noted is a necessary condition for accurate current measurement. In addition, both transformers have very high permeability and extremely low exciting current, which are also important for accurate current measurement. Both transformers have very low phase shift. The total phase angle error for this system is on the order of 0.3%.

The output of each transconductance amplifier 72 is connected to three non-inverting amplifiers 74, one with a gain of one, a second with a gain of four, and the third with a gain of sixteen. The amplifier with unity gain has 10 volts peak output with a service current of 800 amperes, while the amplifier with the gain of four delivers 10 volts with 200 amperes, and the amplifier with the gain of sixteen delivers 10 volts with 50 amperes. Each analog voltage signal is brought to an operational amplifier 76 with an input impedance of 800k ohms. The output of the amplifier is 9.33 volts peak for 528 volts RMS.

For each "phase" the voltage waveform is sampled, for example, 10 times during each 60 hertz cycle with a 12 bit analog-to-digital converter 78. Simultaneous with each voltage measurement, the outputs of the three non-inverting current amplifiers are sampled and the highest non-full scale value is multiplied by the voltage reading (4 quadrant multiplication) and by a factor of 1, 4 or 16 depending on which amplifier's output is used. This yields an instantaneous power value. The instantaneous power values for each phase are integrated over a period of 15 minutes to yield a kilowatt-hour value and all "phases" are added together for a total kilowatt-hour value. This total value is stored in battery-backed random access memory (RAM) 80 for reporting, e.g., in a final spread sheet of power consumption.

If instantaneous values of voltage, amperes and wattage for each phase are requested by the ground unit, the voltage and current waveforms can be sampled 10 times a cycle for 10 seconds. The voltage values are processed in an RMS calculation. The current values are taken from the appropriate amplifier (i.e., gain of 1, 4 or 16) as noted above, and also processed in an RMS calculation.

Kilowatt-hours for each phase is then calculated as described above, except now for 10 seconds. Kilowatt-hours for each phase is multiplied by 360 to yield the average kilowatt value for the 10 second sampling period. Thus, the system is capable of reporting instantaneous voltage, amperes and wattage.

Digital electronics of the pole unit further include an eight bit microprocessor 82, along with 32 kilobytes of RAM 80 backed by an on-board lithium battery 84. A calendar-clock chip 86 is provided, which is also backed by the lithium battery. The battery has a ten year life expectancy. An EPROM 88 provides firmware. In the embodiment described below, pole unit software accumulates kilowatt-hour values every fifteen minutes and places the results into RAM 80, while tracking the date and time obtained from the on-board calendar clock chip 86. If a command is received from the ground unit, the kilowatt-hour task accumulation is suspended and the command is serviced, after which the processor 82 resumes normal data accumulation.

The pole unit is also fitted with an "off-the-shelf" infrared transceiver 90. Transceiver 90 is mounted to communicate through apertures on a lower surface of the enclosure. Red optical filters (not shown) cover the apertures to block visible light. Preferably, the transceiver assembly is mounted offset 15° from a line of sight looking straight down so that a person on the ground need not stand directly next to the pole in order to communicate with the unit. Communication is at 19,200 Baud to facilitate rapid download of information.

Ground unit 14 has four principal components; namely, a Hewlett Packard HP100 palm top PC 100, an infrared transceiver 102, a circuit board 104 with interface communications 106 between the HP100 and the transceiver, and a special plastic weather tight enclosure 108 to protect the unit when used outdoors. Enclosure 108 provides a clear plastic window over the HP100 screen and a flexible clear plastic sheet over the keyboard so that the keys may be depressed without compromising weather tight protection for outdoor use.

A red plastic panel (not shown) serves double duty as the rear wall of the enclosure as well as a visible light filter for IR transceiver 102. The palm top computer 100 is equipped with a 1 megabyte battery backed RAM card 110 for program and data storage. The computer has its own rechargeable battery 112 and a second rechargeable battery 114 is provided for IR transceiver 102. A separate charger 116 is provided for the IR transceiver module and the charger connection input 118 is fed to charger 116 and the palm top's battery charger 120 such that when plugged into a standard wall outlet, ground unit 14 recharges both battery 112 and battery 114. An RS232 connection 122 facilitates downloading of history files to a central office computer (not shown) from RAM 110 of palm top computer 100.

Next, as examples, embodiments of pole unit processing (FIGS. 10a & 10b) and ground unit processing (FIGS. 11a & 11b) are presented.

Figure 10A:
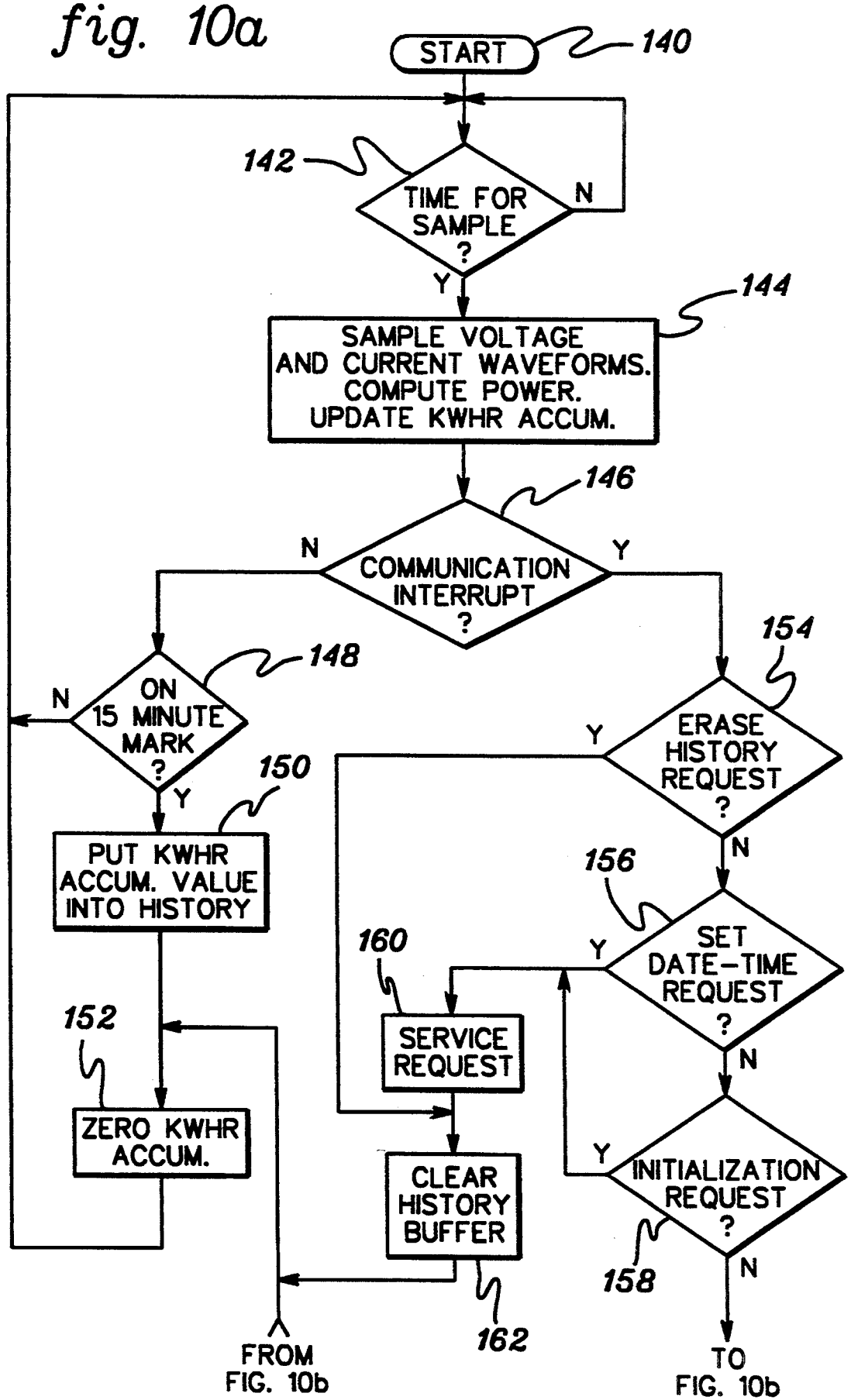
FIGS. 10a & 10b are a flowchart of one embodiment of pole unit processing for secondary load monitoring in accordance with the invention.

Referring to FIG. 10a, processing flow for pole unit 12 starts, 140 "Start," in a main processing loop with inquiry 142 "Time For Sample?" In the embodiment presented, sampling of voltage and current is assumed to occur 10 times per cycle. When sample time is confirmed, the voltage and current waveforms are sampled, power is computed and a kilowatt-hour accumulator is updated by adding the computed power value to previous accumulated kilowatt-hour total, 144 "Sample Voltage And Current Waveforms. Compute Power. Update KWHR Accum." Thereafter, processing inquires whether a communication interrupt from a ground unit has occurred, 146 "Communication Interrupt? Assuming "no" processing determines whether a predetermined period of time, e.g., fifteen minutes, has expired for moving the accumulated kilowatt-hour value into a history memory, 148 "On Fifteen Minute Mark?" If "yes," then the accumulated kilowatt-hour value is placed in history memory, 150 "Put KWHR Accum. Value Into History," and the accumulator is zeroed for commencement of a next fifteen minute period, 152 "Zero KWHR Accum." Thereafter, the processor returns to inquiry 142 where it awaits the next sample interval.

When a communication interrupt signal is received from a ground unit, processing determines whether the ground unit is requesting a history file erase, 154 "Erase History Request?" If "yes," then the history file is cleared, 162 "Clear History Buffer," and processing loops back to inquiry 142 of the pole unit's main processing loop. Assuming history file erase is not being requested, then the processor determines whether a resetting of the date/time is requested, 156 "Set Date/Time Request?" If "yes," the request is serviced, 160 "Service Request," and the history file is cleared, 162 "Clear History Buffer," before return is made to inquiry 142. If the date/time is not being reset, then processing determines whether an initialization is requested, 158 "Initialization Request?" Again, if "yes," the request is serviced, 160 "Service Request," and the history file is cleared, 162 "Clear History Buffer."

Figure 10B:
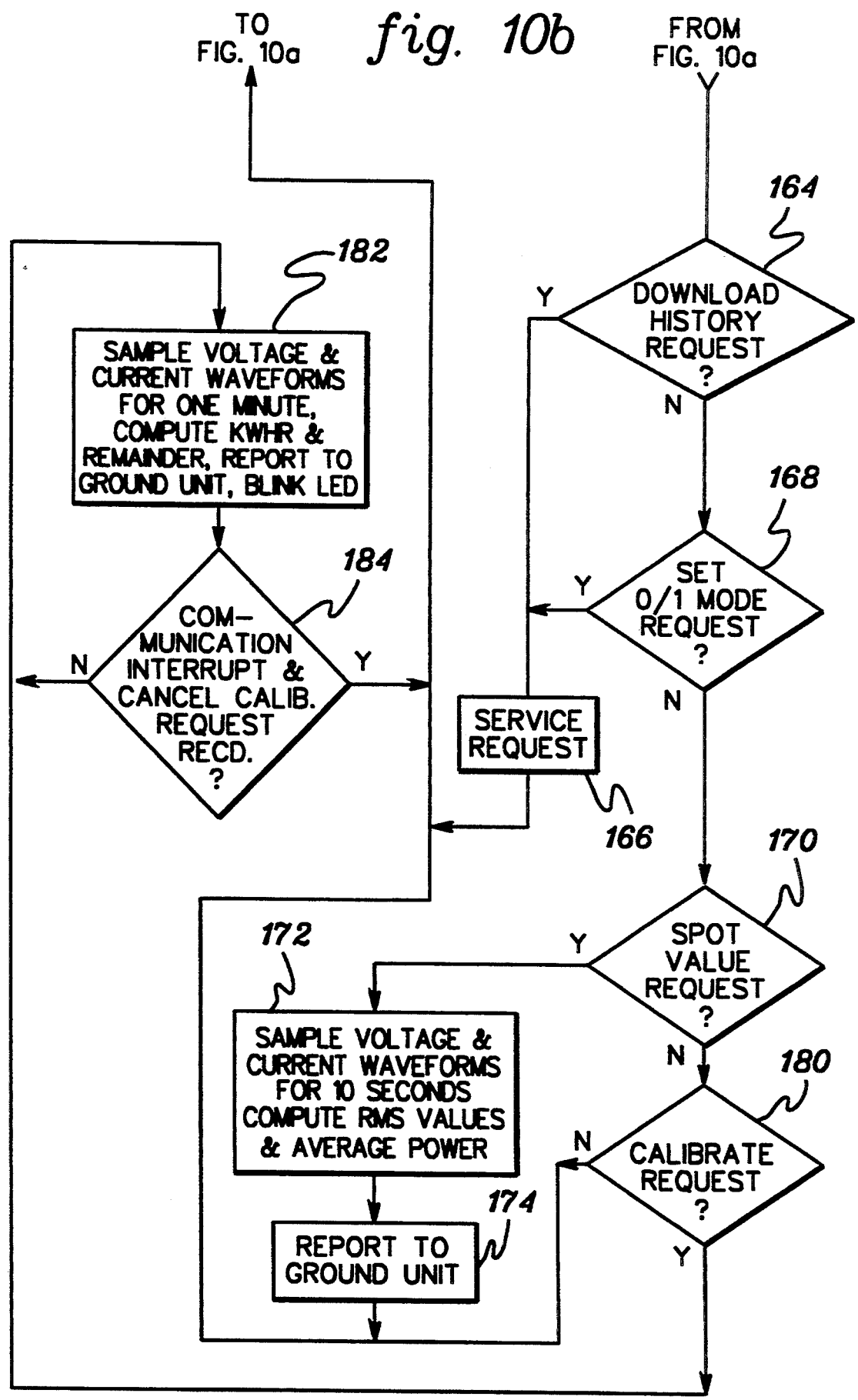

Proceeding further, if signals from the ground unit do not comprise an initialization request, processing determines in FIG. 10b whether a download history is requested, 164 "Download History Request?" If "yes," then the request is serviced by sending the entire history buffer down to the ground unit, 166 "Service Request." With the configuration presented herein, download of a complete history RAM file will take approximately 25 seconds. If the answer to inquiry 146 is "no" then processing determines whether a set mode request is being received from the ground unit, 168 "Set 0/1 Mode Request?" As used herein, mode "0" means a mode wherein when the history buffer is full, receipt of each new fifteen minute kilowatt-hour accumulated value will cause a dumping of the oldest such value in the history buffer to provide room to accommodate the new kilowatt-hour value. In mode "1," processing is terminated whenever the history buffer is full. Thus, once all the history buffer is used (for example, filled with five months worth of data), then processing of the pole unit is terminated until the filled buffer is downloaded to a ground unit. If a set mode request is received, the request is serviced, 166 "Service Request," the Kilowatt-hour accumulated is zeroed, 152 "Zero KWHR Accum.," and processing returns to inquiry 142 of the main processing flow.

Assuming that a mode request set is not received, processing next determines whether a spot value request is being sent, 170 "Spot Value Request?" As noted above, the secondary load monitoring system preferably is capable of providing a ground unit operator with instantaneous voltage and current values, along with an average power value. This function occurs in response to a "spot value request" from the ground unit. Thus, voltage and current waveforms are sampled for a short interval of time, for example, ten seconds, and RMS values and average power are computed, 172 "Sample Voltage & Current Waveforms For Ten Seconds, Compute RMS Values & Average Power." Once computed, the values are reported to the ground unit, 174 "Report To Ground Unit," and return is made to instruction 152 and hence inquiry 142 of FIG. 10a.

If spot values are not requested, then inquiry 180 determines whether a calibration of the system is requested, 180 "Calibrate Request?" If "yes," then the voltage and current waveforms are sampled for one minute, kilowatt-hour and any remainder is computed, the values are reported to the ground unit and the calibration LED in the pole unit is blinked (for coordinating the calibration process), 182 "Sample Voltage & Current Waveforms For One Minute, Compute KWHR & Reminder, Report To Ground Unit, Blink LED." Once completed, processing determines whether a communication interrupt and calibration cancel request is being received, 184 "Communication Interrupt & Cancel Calib. Request Recd.?" If "no," then the voltage and current waveforms are again sampled for one minute, a kilowatt-hour value is computed and the information is sent to the ground unit via instruction 182. When calibration is complete, processing zeros the kilowatt-hour accumulator at instruction 152 and returns to inquiry 142 within its main processing loop (FIG. 10a)

Figure 11A:
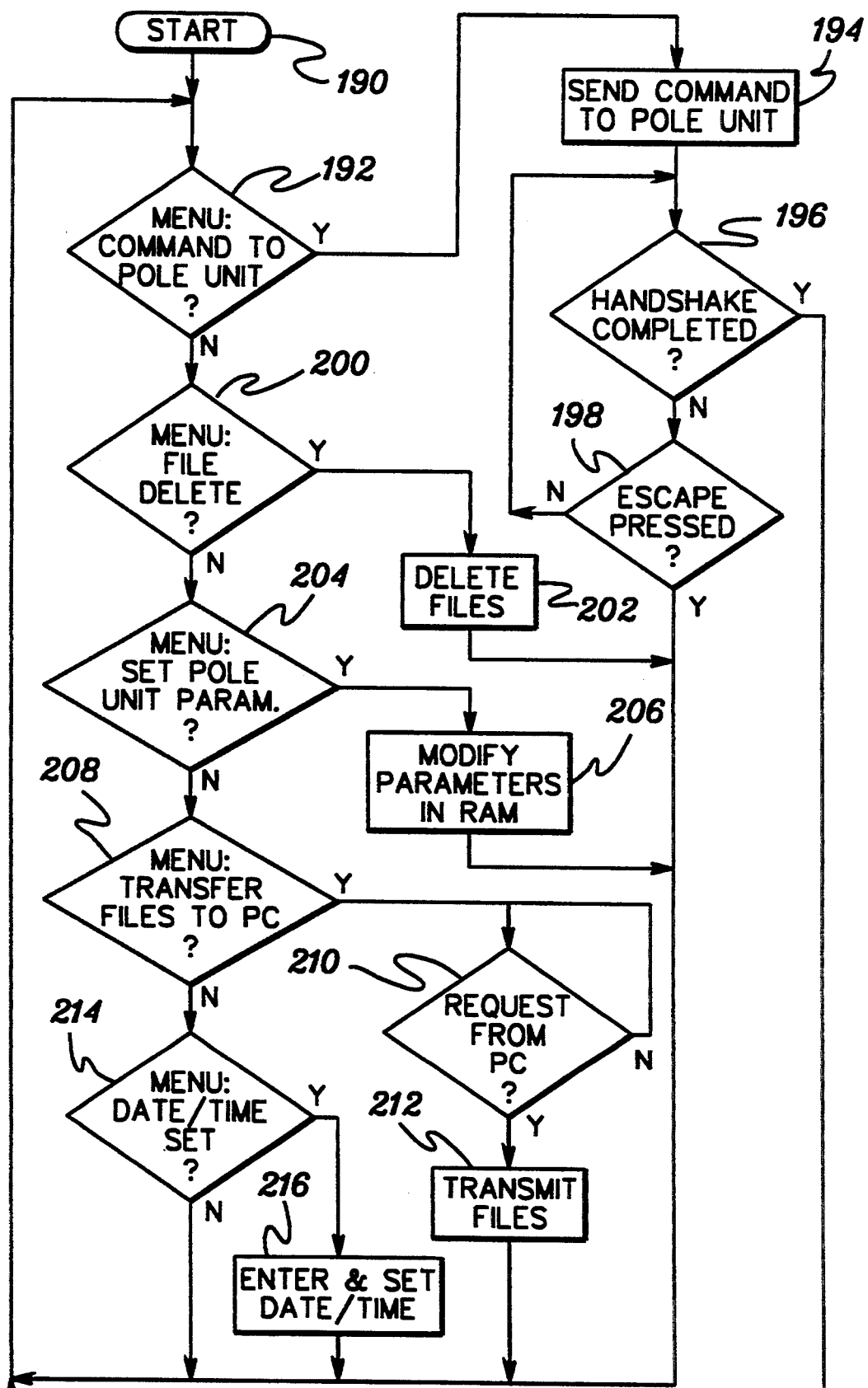
FIGS. 11a & 11b are a flowchart of one embodiment of ground unit processing for secondary load monitoring in accordance with the invention.
Figure 11B:
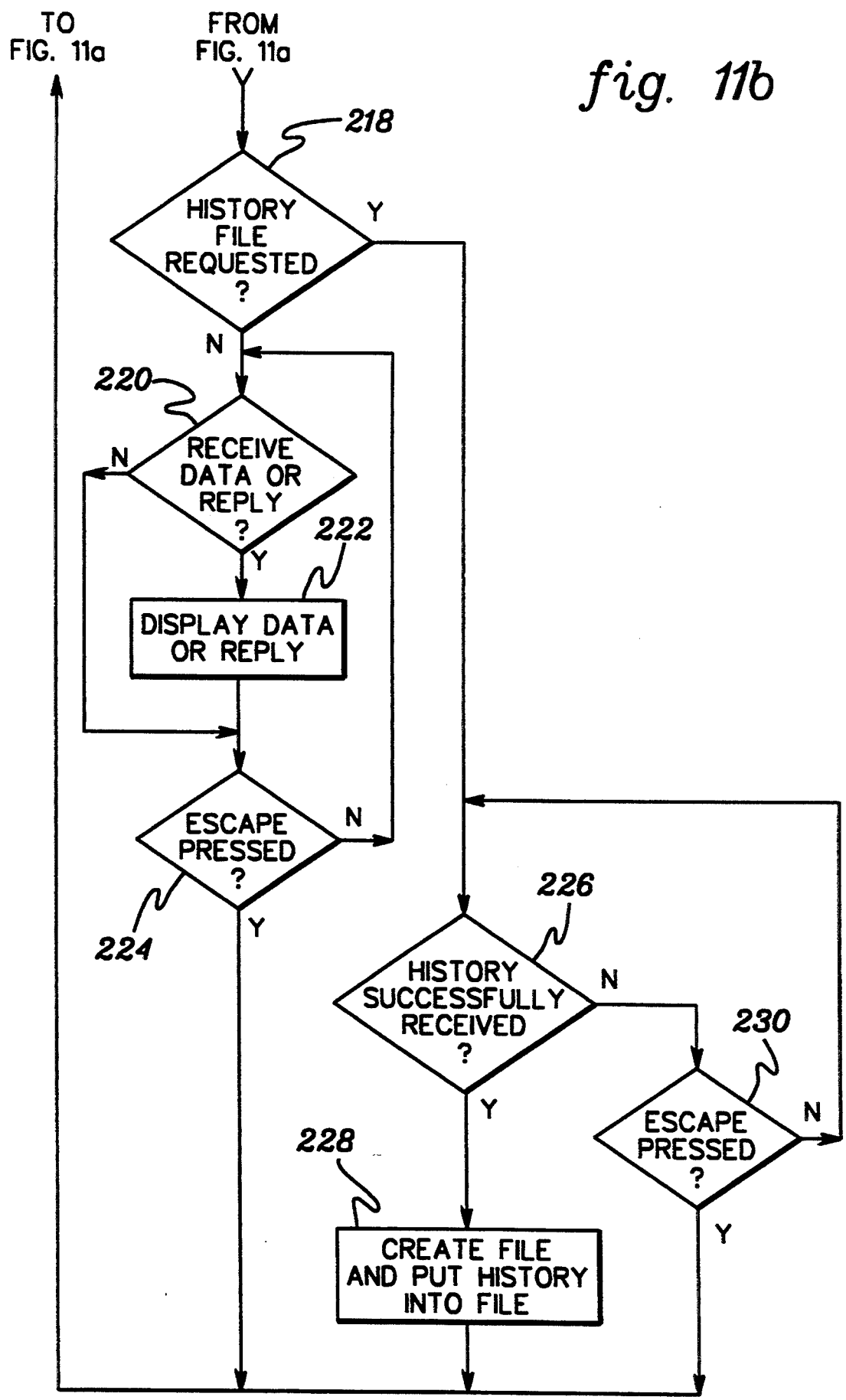

One processing flow embodiment for ground unit 14 of the secondary load monitoring system of the present invention is depicted in FIGS. 11a & 11b. Beginning with FIG. 11a, 190 "Start," the computer initially determines whether a pole unit command has been selected by an operator, 192 "Menu: Command To Pole Unit?" If "yes," then the command is sent to the pole unit, 194 "Send Command To Pole Unit," and inquiry occurs into whether the communication is properly received, 196 "Handshake Completed?" If "yes," processing proceeds to the inquiries and instructions of FIG. 11b. Otherwise inquiry is made into whether the operator has pressed a processing escape key, 198 "Escape Pressed?" If "no," processing returns to inquiry 196 to determine if the appropriate handshake commands have been received from the pole unit.

If a command is not selected for transfer to the pole unit, then processing inquires whether a file delete command has been pressed, 200 "Menu: File Delete?" If "yes," then the selected file is deleted, 202 "Delete File," and processing loops back to inquiry 192. If file delete is not selected, processing inquires whether pole parameters are to be set, 204 "Menu: Set Pole Unit Param.?" If the operator has selected pole unit parameters for setting, then the selected parameters are modified, 206 "Modified Parameters In RAM," and return is made to inquiry 192 to determine whether a command to the pole unit is to be sent.

Next, processing determines whether files are to be retransferred to a central office computer using the noted RS232 communication port, 208 "Menu: Transfer Files To PC?" If "yes," then processing in the ground unit determines whether appropriate request or acknowledgement has been received from the computer to which files are to be transferred, 210 "Request From PC?" If "no," then processing remains at inquiry 210 until the proper acknowledgement is received. Once received, the selected files are transmitted, 212 "Transmit Files."

From inquiry 208, final inquiry of FIG. 11a directs processing to determine whether the operator has selected the date and/or time setting, 214 "Menu: Date/Time Set?" If "yes,[ then the data is entered and the date/time is set, 216 "Enter & Set Date/Time." Thereafter processing returns to inquiry 192.

As noted, processing proceeds from FIG. 11a to FIG. 11b from inquiry 196 upon confirmation that the appropriate acknowledgements have been received between the pole unit and ground unit. In FIG. 11b, processing initially inquires whether the operator of the ground unit is requesting a history file download, 218 "History File Requested?" If "yes," then the requested file is downloaded to the ground unit and processing determines whether the file is successfully received, 226 "History Successfully Received?" If "no" then processing inquires whether the operator of the ground unit has pressed an escape key, 230 "Escape Pressed?" Again if "no," processing returns to inquiry 226 to determine whether the history file has now been successfully received. If the escape is pressed, then processing returns to inquiry 192 of FIG. 11a. Once the history file is successfully received at the ground unit, the ground unit creates a memory file and places the downloaded information into the memory file, 228 "Create File And Put History Into File." Thereafter, processing returns to inquiry 192 of FIG. 11a.

Assuming that a history file is requested, then processing determines whether data or a reply is received from the pole unit in response, 220 "Received Data Or Reply?" If "yes," the data or reply is displayed for the operator, 222 "Display Data Or Reply." Next, processing inquires whether an escape key has been pressed by the operator, 224 "Escape Pressed?" If "no" processing loops back to inquiry 220 to again inquire whether data or a reply has been received in response from the pole unit. Once the escape key has been pressed, processing returns to the flow of FIG. 11a, and in particular to inquiry 192.

Those skilled in the art will note from the above discussion that sensor apparatus and a monitoring system are presented herein for unintrusively monitoring parameters such as current and voltage provided through a service line to a customer for verifying accuracy of the customer's entrance meter. Corresponding kilowatt-hour values are automatically periodically determined and saved in a history file. Information is downloaded via an IR link for transport to a central office where the secondary readings are compared with the customer's entrance meter readings. A compact line sensor is employed which is unlikely to draw a customer's attention. Installation is quick and easy, again so as not to draw a customer's attention (e.g., fifteen minutes). Accuracy of the monitoring system presented is minimally, as good as, that of the typical electric entrance meter. Because extensive histories can be generated and saved within the pole unit with corresponding date and time stamps, there is no need to simultaneously read the customer's meter for comparison. The sensor system presented can accommodate all entrance configurations, including secondary voltages through 480 V, three-phase, with various service conductor diameters. Further, currents ranging from 1-800 amperes can be detected with a maximum kilowatt-hour error of less than or equal to five (5%) percent.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. Sensor apparatus for monitoring voltage of a power line having a conductor surrounded by electrical insulation, said sensor apparatus comprising:
   a sensor housing; and
   a voltage clamp mechanism disposed within said sensor housing, said voltage clamp mechanism including an upper support and a lower support sized to cradle the power line there between, and clamping means for forcing said upper support towards said lower support, said lower support being spring biased away from a supporting surface of said sensor housing to which the lower support is affixed and having an insulation piercing voltage sensor disposed in an opening therein, said insulation piercing voltage sensor being fixedly mounted relative to said supporting surface of said sensor housing to which the lower support is affixed and shaped to pierce the electrical insulation surrounding the conductor of the power line when exposed from said lower support, wherein when the power line is cradled between said upper support and said lower support and when the upper support is forced against the power line by said clamping means, the lower support is moved towards the supporting surface of the sensor housing to which the lower support is affixed and the insulation piercing voltage sensor is exposed from the lower support to pierce the electrical insulation and physically contact the conductor of the power line for monitoring voltage thereon.

2. The sensor apparatus of claim 1, wherein the sensor housing has an upper portion pivotally connected to a lower portion, and wherein the upper support of the voltage clamp mechanism resides within the upper portion of the sensor housing and the lower support of the voltage clamp mechanism resides within the lower portion of the sensor housing.

3. The sensor apparatus of claim 1, wherein said voltage clamp mechanism includes limiting means for limiting piercing of the power line by the insulation piercing voltage sensor as the upper support of the voltage clamp mechanism is forced against the power line by said clamping means.

4. The sensor apparatus of claim 3, wherein said clamping means comprises ratcheting clamping means for forcing the upper support towards the lower support and for discontinuing said forcing of the upper support towards the lower support when piercing of the power line by the insulation piercing voltage sensor is limited by said limiting means.

5. Sensor apparatus for monitoring current and voltage of a power line having a conductor surrounded by electrical insulation, said sensor apparatus comprising:
   a sensor housing having an upper portion pivotally connected to a lower portion;
   a split-core current transformer for monitoring current passing through said power line, an upper half of said split-core current transformer residing within the upper portion of said sensor housing and a lower half of said split-core current transformer residing within the lower portion of said sensor housing; and
   a voltage sensor for monitoring voltage of said power line, said voltage sensor having an upper support and a lower support sized to cradle said power line when said sensor housing is closed about said power line, the upper support of said voltage sensor residing in the upper portion of the sensor housing and the lower support of said voltage sensor residing in the lower portion of the sensor housing, said voltage sensor further comprising clamping means for forcing the upper support towards the lower support, said lower support being spring-biased away from a supporting surface of the lower portion of said sensor housing and having an insulation piercing member disposed in an opening therein, said insulation piercing member being fixedly mounted relative to the sensor housing and shaped to pierce the electrical insulation surrounding the conductor of the power line when exposed from said lower support as the upper portion of the sensor housing is forced towards the lower portion of the sensor housing with the power line disposed there between, wherein when the power line is cradled between the upper support and the lower support of the voltage sensor and the upper portion of the sensor housing is forced against the power line by the clamping means, the lower support is moved towards the supporting surface of the sensor housing and the insulation piercing member is exposed from the lower support surface to pierce the electrical insulation of the power line and physically contact the conductor such that the sensor housing can be clamped to the power line to simultaneously establish a voltage connection to the conductor of the power line through the insulation piercing member, to monitor voltage of the conductor, and locate the upper half of the split-core current transformer relative to the lower half of the split-core current transformer, to monitor current through the conductor.

6. The sensor apparatus of claim 5, wherein said clamping means comprises a ratcheting clamping means having limiting means for limiting piercing of the power line by the insulation piercing member, wherein piercing of the power line is terminated by said limiting means after the insulation piercing member makes physical contact with the conductor of the power line.

7. The sensor apparatus of claim 6, wherein said ratcheting clamping means includes driving means for driving the upper support against the power line and means for disengaging said driving means when the insulation piercing member has pierced the electrical insulation and contacted the conductor of the power line.

8. The sensor apparatus of claim 5, wherein the split-core current transformer includes a magnetic field shield to shield the current transformer from external magnetic fields.

9. The sensor apparatus of claim 8, wherein the split-core current transformer has a tape wound core of eighty (80%) percent nickel and twenty (20%) percent iron with lapped pole faces.

10. The sensor apparatus of claim 5, further comprising a controller electrically connected to the split-core current transformer and to the voltage sensor for monitoring current and voltage of the power line at periodic intervals, and memory means coupled to the controller for storing monitored current and voltage readings.

11. The sensor apparatus of claim 10, wherein said controller includes means for computing power consumption in kilowatt-hours and for date and time stamping each kilowatt-hour computation for storing thereof in said memory means as a history file of kilowatt-hour usage.

12. The sensor apparatus of claim 10, wherein said controller and said memory means are powered through the voltage sensor by the monitored voltage on the power line.

13. The sensor apparatus of claim 12, wherein the sensor housing includes means for indicating a necessary direction of connection of the sensor apparatus to the power line, said necessary direction of connection being such that said split-core current transformer is disposed downstream from the voltage sensor relative to current flow in the power line.

14. The sensor apparatus of claim 10, wherein the controller and the memory means are disposed external to and removed from the sensor housing, and wherein the controller and memory means are electrically coupled to the split-core current transformer and the voltage sensor via at least one electrical cable.

15. The sensor apparatus of claim 10, further comprising means for facilitating calibration of the sensor apparatus.

16. Sensor apparatus for monitoring current of a power line having a conductor surrounded by electrical insulation, said sensor apparatus comprising:
   a sensor housing having an upper portion pivotally connected to a lower portion, said upper portion and said lower portion being sized to receive the power line such that the power line passes through the sensor housing when the sensor housing is closed thereabout;
   a split-core current transformer for monitoring current passing through said power line, an upper half of said split-core current transformer residing within the upper portion of said sensor housing and a lower half of said split-core current transformer residing within the lower portion of said sensor housing;
   a controller disposed external to and removed from the sensor housing and having memory and a tandem current transformer; and
   an electrical cable coupling the split-core current transformer to the tandem current transformer of the controller, said split-core current transformer having a secondary winding connected to a primary winding of said tandem current transformer, said split-core current transformer and said tandem current transformer cooperating to monitor current through the power line over a current range of one to at least 200 hundred amperes.

17. The sensor apparatus of claim 16, wherein the split-core current transformer and the tandem current transformer cooperate to monitor current through the power line over a current range of 1 to 800 amperes.

18. The sensor apparatus of claim 17, wherein the electrical cable is greater than two feet in length.

19. The sensor apparatus of claim 16, wherein the split-core current transformer includes a magnetic field shield to shield the split-core current transformer from external magnetic fields.

20. The sensor apparatus of claim 19, wherein the split-core current transformer has a tape wound core of eighty (80%) nickel and twenty (20%) iron with lapped pole faces.

21. A sensor system for monitoring a power line consisting of a conductor surrounded by electrical insulation, said sensor system comprising:
   a line-mounted sensor apparatus including
      (i) a sensor housing, and
      (ii) a voltage clamp mechanism disposed within the sensor housing, the voltage clamp mechanism including an upper support and a lower support sized to cradle the power line there between, and clamping means for forcing the upper support towards the lower support, the lower support being spring-biased away from a supporting surface of the sensor housing to which the lower support is affixed and having an insulation piercing voltage sensor disposed in an opening therein, the insulation piercing voltage sensor being fixedly mounted relative to the supporting surface of the sensor housing to which the lower support is affixed and shaped to pierce the electrical insulation surrounding the conductor of the power line when exposed from said lower support, wherein when the power line is cradled between the upper support and the lower support and the upper support is forced against the power line by the clamping means, the lower support is moved towards the supporting surface of the sensor housing to which the lower support is affixed and the insulation piercing voltage sensor is exposed from the lower support to pierce the electrical insulation and physically contact the conductor of the power line for monitoring voltage thereof;
   data memory for storing data representative of monitored voltage of the power line; and
   control means, electrically coupled to the insulation piercing voltage sensor of the voltage clamp mechanism and to the data memory, for controlling periodic monitoring of voltage on the conductor of the power line and for storing monitored voltage in said data memory such that a history of voltage on the conductor is compiled.

22. The sensor system of claim 21, wherein said data memory and said control means reside within a data processing unit, said data processing unit being external to and remote from said line-mounted sensor apparatus and being coupled to said line-mounted sensor apparatus via at least one electrical cable.

23. The sensor system of claim 22, wherein said data processing unit includes means for mounting said data processing unit to a pole supporting the power line.

24. The sensor system of claim 22, wherein the data processing unit is powered through the insulation piercing voltage sensor by voltage on the conductor of the power line.

25. The sensor system of claim 22, wherein the line-mounted sensor apparatus further comprises a split-core current transformer for monitoring current passing through the power line, and wherein the sensor housing has an upper portion pivotally connected to a lower portion, an upper half of the split-core current transformer residing within the upper portion of the sensor housing and a lower half of the split-core current transformer residing within the lower portion of the sensor housing.

26. The sensor system of claim 25, wherein the control means includes means for periodically monitoring voltage and current of the power line and for computing kilowatt-hours based thereon, and for saving each kilowatt-hour computation in the data memory such that a history of kilowatt-hour usage is compiled.

27. The sensor system of claim 25, wherein the data processing unit includes a tandem current transformer coupled and sized to cooperate with the split-core current transformer to measure current on the conductor of the power line over a range of current from 1 ampere to greater than 200 hundred amperes.

28. The sensor system of claim 21, wherein the sensor system is capable of monitoring multiple power lines each consisting of a conductor surrounded by electrical insulation, said sensor system including multiple line-mounted sensor apparatus, each line-mounted sensor apparatus being coupled to a different one of the multiple power lines.

29. The sensor system of claim 26, further comprising a hand-held ground unit capable of communicating remotely with the data processing unit such that the history of voltage on the conductor can be downloaded to the hand-held ground unit for transfer to a central computer for comparison of the kilowatt-hour usage history from the sensor system with kilowatt-hour usage from an entrance meter connected to the power line.

30. The sensor system of claim 29, wherein the hand-held ground unit communicates with the data processing unit via infrared signals, said hand-held ground unit and said data processing unit each having an infrared transceiver.

31. Sensor apparatus for monitoring current and voltage of a power line having a conductor surrounded by electrical insulation, said sensor apparatus comprising:
- a sensor housing having an upper portion pivotally connected to a lower portion;
- a split-core current transformer for monitoring current passing through said power line, an upper half of said split-core current transformer residing within the upper portion of said sensor housing and a lower half of said split-core current transformer residing within the lower portion of said sensor housing;
- a voltage sensor for monitoring voltage of said power line, said voltage sensor having an upper support and a lower support sized to cradle said power line when said sensor housing is closed about said power line, the upper support of said voltage sensor residing in the upper portion of the sensor housing and the lower support of said voltage sensor residing in the lower portion of said sensor housing, said voltage sensor further including an insulation piercing member capable of piercing the electrical insulation of the power line as the upper portion of the sensor housing is forced towards the lower portion of the sensor housing with the power line disposed therebetween;
- a controller electrically coupled to the split-core current transformer and to the voltage sensor for monitoring current and voltage of the power line at periodic intervals, and memory means coupled to the controller for storing monitored current and voltage readings, said controller and said memory means being disposed external to and removed from the sensor housing, said controller and said memory means being electrically coupled to the split-core current transformer and the voltage sensor via at least one electrical cable;
- a tandem current transformer connected to the controller and the memory means, said tandem current transformer also being disposed external to and removed from the sensor housing, said tandem current transformer being coupled to said split-core current transformer via the at least one electrical cable such that a secondary winding of the split-core current transformer is connected to a primary winding of the tandem current transformer, said split-core current transformer and said tandem current transformer cooperating to monitor a wide range of potential current in the power line, said wide range of potential current being from approximately 1 ampere to at least 200 amperes; and
- wherein when the power line is cradled between the upper support and the lower support of the voltage sensor and the upper portion Of the sensor housing is in opposing relation with the lower portion of the sensor housing, the sensor housing can be clamped to the power line to simultaneously establish a voltage connection to the conductor of the power line through the insulation piercing member, such that voltage of the conductor can be monitored, and to locate the upper half of the split-core current transformer relative to the lower half of the split-core current transformer, such that current through the conductor can be monitored.

* * * * *

UNITED STATES PATENT AND TRADEMARK OFFICE
CERTIFICATE OF CORRECTION

PATENT NO. : 5,426,360
DATED : Jun. 20, 1995
INVENTOR(S) : Maraio et al.

It is certified that error appears in the above-indentified patent and that said Letters Patent is hereby corrected as shown below:

Column 7, line 6, delete "I," and substitute therefor --$I_S$--.

Signed and Sealed this

Tenth Day of October, 1995

Attest:

BRUCE LEHMAN

Attesting Officer

Commissioner of Patents and Trademarks